(12) United States Patent
Wu

(10) Patent No.: US 7,020,858 B1
(45) Date of Patent: Mar. 28, 2006

(54) METHOD AND APPARATUS FOR PRODUCING A PACKAGED INTEGRATED CIRCUIT

(75) Inventor: Paul Ying-Fung Wu, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 182 days.

(21) Appl. No.: 10/241,428

(22) Filed: Sep. 10, 2002

(51) Int. Cl.
*G06F 17/50* (2006.01)
(52) U.S. Cl. .......................................... 716/5
(58) Field of Classification Search .............. 716/5, 716/1
See application file for complete search history.

(56) References Cited

U.S. PATENT DOCUMENTS

| | | | | |
|---|---|---|---|---|
| 4,551,810 | A | * | 11/1985 | Levine ..................... 700/182 |
| 5,608,638 | A | * | 3/1997 | Tain et al. ................ 700/121 |
| 6,041,269 | A | * | 3/2000 | Tain ........................ 700/121 |
| 6,357,036 | B1 | * | 3/2002 | Eka et al. ................. 715/15 |
| 6,569,094 | B1 | * | 5/2003 | Suzuki et al. ............. 600/300 |
| 6,581,189 | B1 | * | 6/2003 | Tain ......................... 716/3 |
| 6,665,853 | B1 | * | 12/2003 | LeCoz ...................... 716/12 |

OTHER PUBLICATIONS

Prolinx Labs Corporation, ViperBGA Designer 2.0 ViperBGA Specifier 2.0 User's Guide, Copyright 1996, 1997, 1998, ProLinx Labs Corporation, San Jose.

* cited by examiner

*Primary Examiner*—Stacy A. Whitmore
(74) *Attorney, Agent, or Firm*—John J. King; LeRoy D. Maunu; Edel M. Young

(57) ABSTRACT

A method of producing a wirebond ball grid array package is described. The method comprises the steps of importing a master pinlist to a computer program, importing a bonding diagram to the computer program, and verifying, by the computer program, substrate artwork against the master pinlist and the bonding diagram. A method of producing a wirebond ball grid array package according to an alternative embodiment comprises the steps of importing a master pinlist to a computer program, importing substrate artwork to the computer program, and verifying, by the computer program, a bonding diagram against the master pinlist and the substrate artwork. Finally, a system for verifying substrate artwork comprises means for importing a master pinlist to a computer program, means for importing a bonding diagram to the computer program, and means for verifying, by the computer program, the substrate artwork against the master pinlist and the bonding diagram.

33 Claims, 6 Drawing Sheets

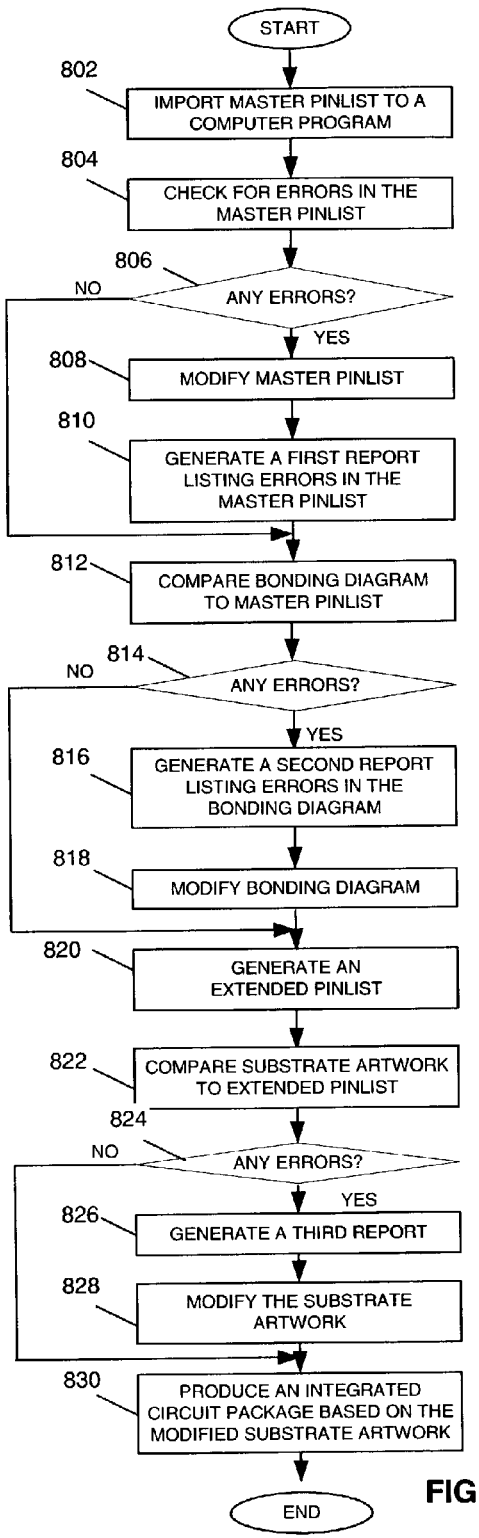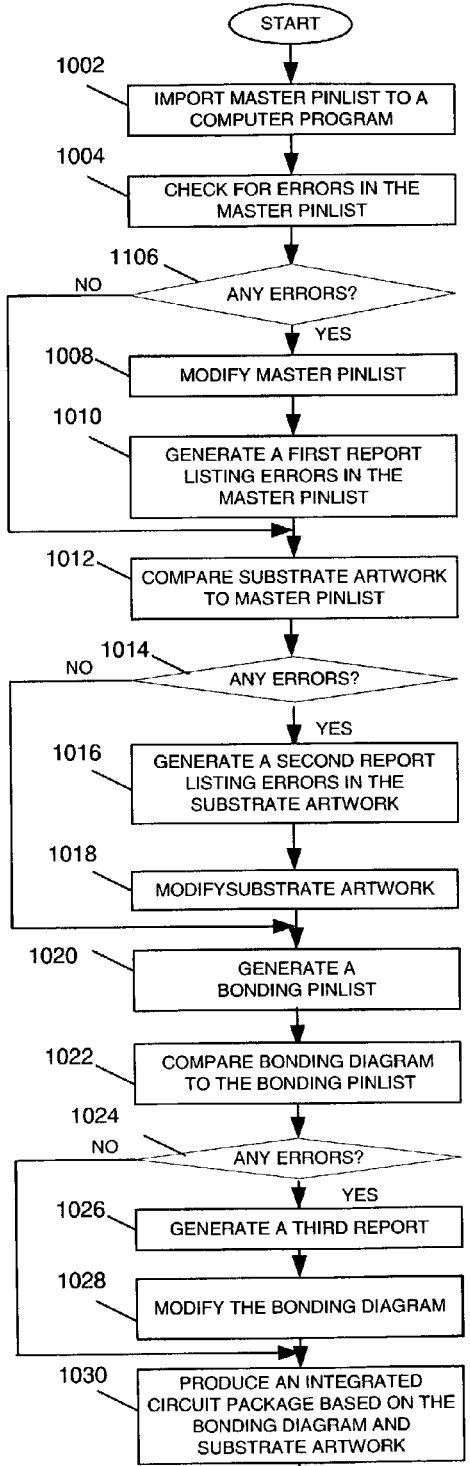

METHOD AND APPARATUS FOR PRODUCING A PACKAGED INTEGRATED CIRCUIT

FIELD OF THE INVENTION

This invention relates generally to packaging integrated circuits, and in particular, to a method and an apparatus for verifying bonding diagrams and substrate artwork during the design and manufacture of a ball grid array package.

BACKGROUND OF THE INVENTION

As integrated circuits (ICs) continue to become smaller in size and the circuitry on ICs continues to increase, the number of bonds and the density of the bonds continue to increase. During the manufacture of ICs, silicon wafers having a number of die comprising circuitry are produced according to methods that are well known in the art. A ball grid array (BGA) package is an advanced integrated circuit package comprising a substrate having contacts on the bottom for soldering the integrated circuit package to a circuit board. A BGA package can be formed two ways. A wirebond BGA comprises a die having contact pads which are connected to contact pads on the surface of the substrate by way of wirebonds. A flipchip BGA comprises a die having contact pads that are directly bonded to the substrate using solder bumps. The contact pads on the bottom of the substrate are ultimately soldered to a circuit board. Such wirebond and flipchip BGAs are well known in the art.

A critical part of BGA deployment is to have a design methodology that ensures functional correctness of the design. For a wirebond BGA, the design requires substrate artwork and a bonding diagram that match both the die and the substrate pad patterns.

Most conventional BGA design systems can support netlist driven design, where pad patterns and pin-to-pin interconnects are checked against the netlist or pinlist at all times. Conventionally, BGA designs that are generated from conventional BGA design systems are usually assumed to be correct. However, such conventional systems cannot prevent or detect (i) errors due to wrong setup of the database netlist, (ii) errors created in the artwork mask generation process, or (iii) errors created in subsequent CAD editing processes. Further, such conventional BGA design systems do not provide for a method of verification once the substrate artwork leaves the original design system.

Such conventional BGA design systems require either a complete CAD database or a textual netlist output in order to perform a design check. Furthermore, the availability of the CAD database and/or the textual netlist or pinlist output does not ensure correct verification. That is, errors in the netlist setup of the database may not be apparent to the reviewer, and the textual netlist output that is generated by the CAD system may not be an accurate representation of the actual design.

Design errors that escape early detection result in huge loss in time to market and costly retooling, which are problems for most users of conventional BGA design systems. Errors include (i) bonding errors due to missing bonds, shifted bonds, wrong bonds, (ii) incorrect substrate artwork or (iii) mismatches among a netlist, bonding diagram, and substrate artwork due to errors in one or more databases. Errors could be produced during the design stage, document editing stage, or substrate fabrication stage.

In 1999, a system existed whereby a wirebond BGA design, including substrate artwork, that was generated by Prolinx VBGA design software could be completely checked for pinlist correctness outside of the design system. That is, the substrate artwork could be verified to be correct even if the artwork is modified by other editing software. The same kind of independent pinlist check could also be performed on flipchip designs.

The system could be applied directly to verify any flipchip designs that are generated by other software platforms, including AP Designer APD from Cadence Design Systems, EPD from Cad Design Software, and Encore BGA from Avanti Corp. However, the system could not verify wirebond BGA designs that are generated from these commercial BGA design platforms. The obstacle is due to the fact that wirebond verification requires more information than just a master die and pad pinlist. Extra information that is required is either not available or not reliable.

In the field of semiconductor integrated circuit package design, it is imperative that a layout be thoroughly checked in design rules and pinlist, circuit, and functional specifications before being committed to fabrication. However, conventional BGA design systems do not verify that bonding diagrams and substrate artwork of a wirebond BGA are accurate.

Accordingly, there is a need for a method of and apparatus for verifying a bonding diagram and substrate artwork during the design and manufacture of a BGA.

SUMMARY OF THE INVENTION

A method of producing a wirebond ball grid array is described. The method comprises the steps of importing a master pinlist to a computer program; importing a bonding diagram to the computer program; and verifying, by the computer program, substrate artwork against the master pinlist and the bonding diagram. A method of producing a wirebond ball grid array according to an alternative embodiment comprises steps of importing a master pinlist to a computer program; importing substrate artwork to the computer program; and verifying a bonding diagram against the master pinlist and the substrate artwork. Finally, a system for verifying substrate artwork comprises means for importing a master pinlist to a computer program; means for importing a bonding diagram to the computer program; and means for verifying, by the computer program, the substrate artwork against the master pinlist and the bonding diagram.

BRIEF DESCRIPTION OF THE DRAWINGS

FIG. 8 is a flow chart showing a detailed method of verifying substrate artwork according to the present invention.

FIG. 10 is a flow chart showing a detailed method of verifying a bonding diagram according to the present invention.

DETAILED DESCRIPTION OF THE DRAWINGS

Figure 1:
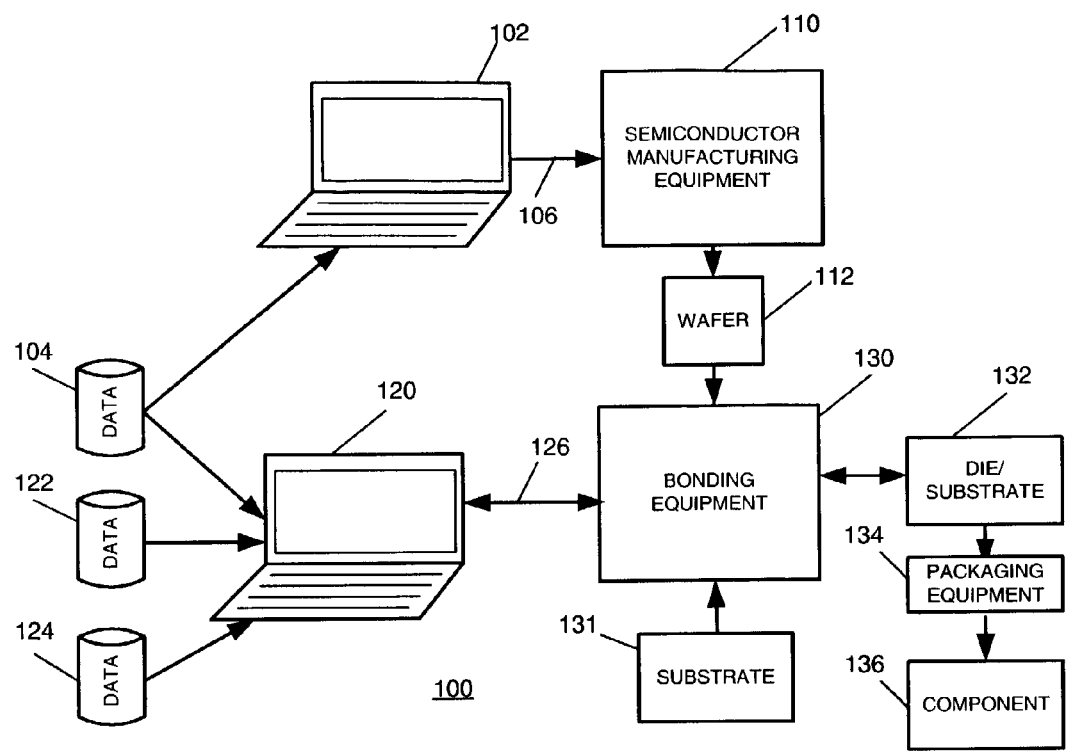
FIG. 1 is a block diagram of a system for designing and manufacturing integrated circuit packages according to the present invention.

Turning now to FIG. 1, a block diagram shows a system for designing and manufacturing integrated circuit packages, such as a wirebond BGA, according to the present invention. The system 100 comprises computer aided design (CAD) equipment 102, which could be any computer adapted to run CAD software. The CAD equipment 102 receives data from a master pinlist 104, and is coupled by a communication link 106 to semiconductor manufacturing equipment 110. The communication link 106 could be any wired or wireless communication link. The semiconductor manufacturing equipment 110 generates a wafer 112 having a plurality of die, as is well-known in the art.

CAD equipment 120, which is also coupled to receive the master pinlist 104, receives a bonding diagram 122 and substrate artwork 124. The CAD equipment 120 is coupled by a communication link 126 to bonding equipment 130. The communication link could be any wired or wireless communication link. The bonding equipment generally bonds the die from the wafer 112 to a substrate 131, as will be described in more detail in reference to other figures. The die/substrate combination 132 is coupled to packaging equipment 134 which generates a finished component 136, such as a wirebond BGA.

The system 100 of the present invention provides a closed-loop verification of a wirebond BGA design that is independent of the design flow, engineering change history, or design software platform. The substrate artwork can be either a direct output of a Computer Aided Design (CAD) system 120 or a final mask that has been manipulated by a Computer Aided Manufacturing (CAM) system and is ready for image transfer to the semiconductor manufacturing equipment 110. One benefit of the present invention is an intelligent artwork database containing both drawing components and a netlist. Thus the procedure is capable of converting a drawing-only piece of artwork (or dumb artwork) into an intelligent design database.

Figure 2:
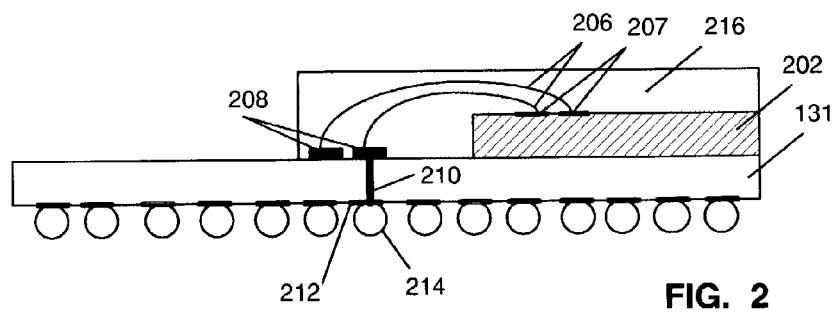
FIG. 2 is a cross-sectional view of the wirebond BGA according to the present invention.

Turning now to FIG. 2, a cross-section of a finished component 136 is shown here as a wirebond BGA. In particular, a die 202 is coupled to the substrate 131 by way of a plurality of wire bonds 206. Contact pads 207 on the die are coupled by the wire bonds 206 to contact pads 208 on the substrate 131. A conductor 210 extends through various layers of the substrate 204 to contact 212 on the bottom of the substrate. Although the conductor 210 is shown extending directly through the substrate 204, the conductor could also comprise traces that run horizontally through the substrate and through a number of layers at another location on the substrate. The contact 212 is bonded to a solder bump 214, which is available to be bonded to a circuit board of an electronic device. The die 202 and wire bonds 206 are encapsulated in a resin 216. The wirebond BGA of FIG. 2 is one example of a device that could be employed according to the present invention. Other types of wirebond BGAs and flip chip BGAs, such as a BGA in a "cavity down" configuration, which is well known in the art, could be employed.

Figure 3:
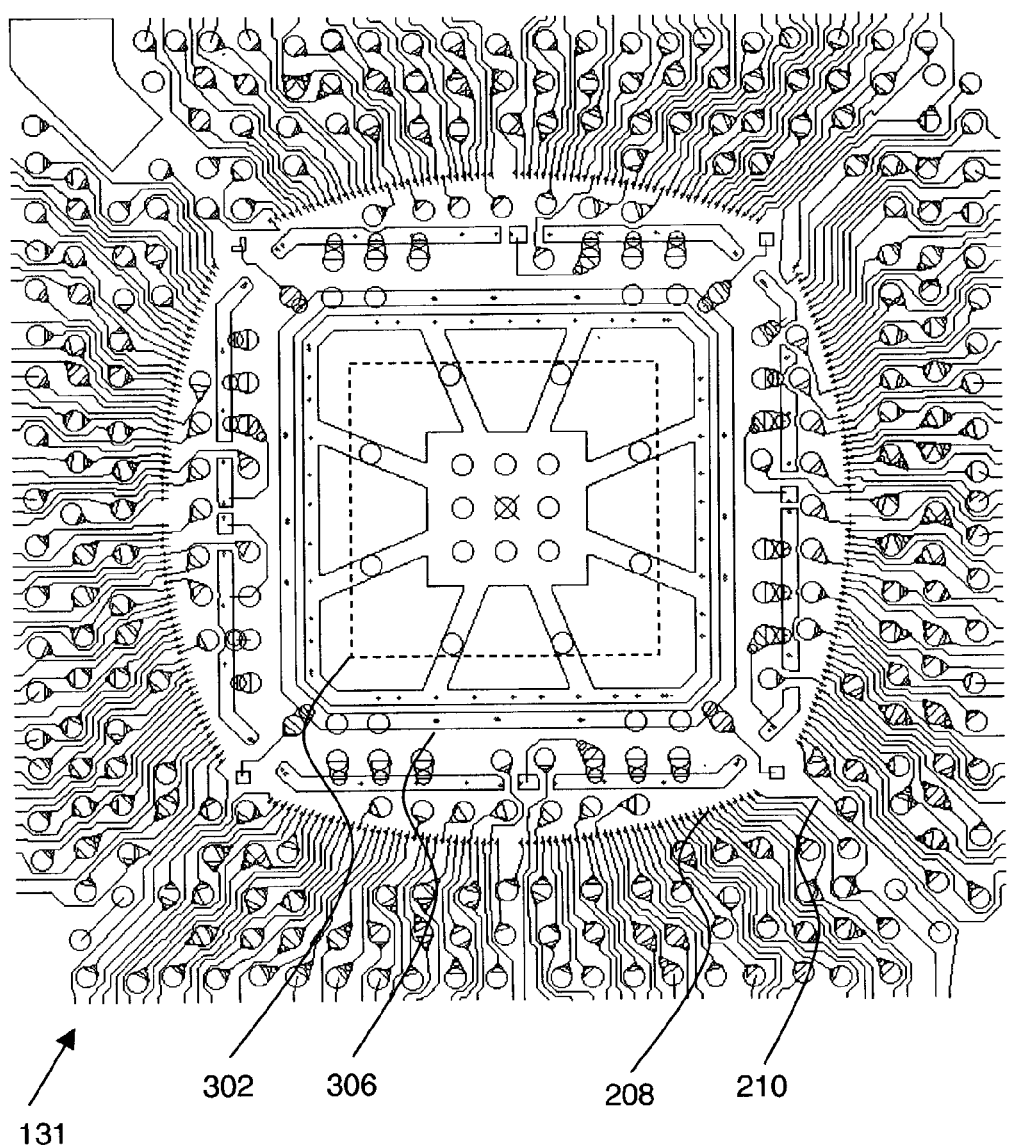
FIG. 3 is a top plan view of a bonding layer on a substrate.
Figure 4:
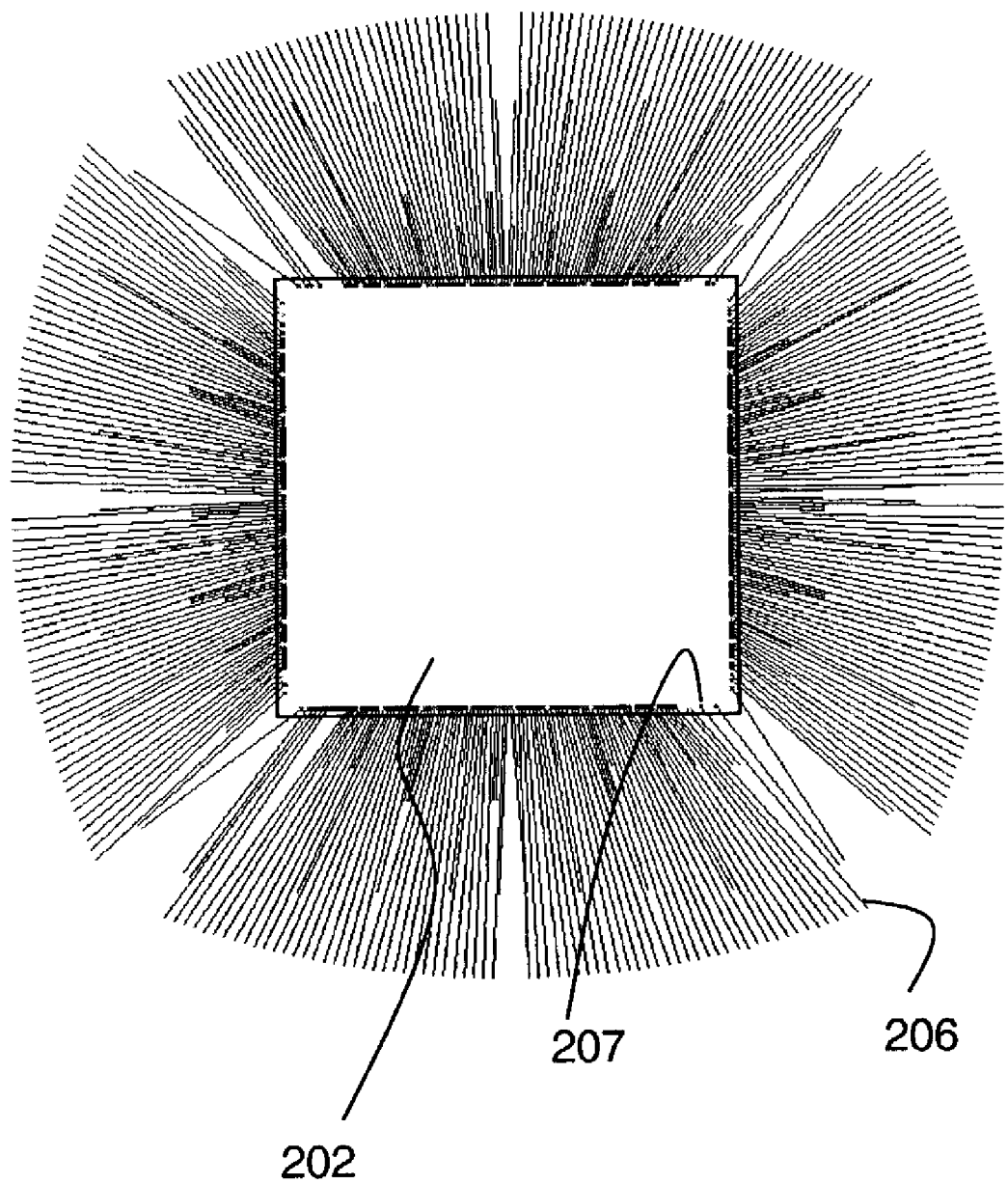
FIG. 4 is a top plan view of a die shown with bond wires.

Turning now to FIGS. 3 and 4, substrate artwork and a corresponding bonding diagram are shown. FIGS. 3 and 4 are shown to the same scale. The structure of FIG. 4 fits within the center portion of FIG. 3. An artwork top view for an exemplary substrate 131 is shown in FIG. 3. The substrate 131 generally includes a portion 302 for receiving the die 202 and a portion 306 for receiving the bonding wires 206. Contact pads 208 on the substrate are coupled to traces 210 on the substrate. The traces 210 form a connection between the contact pads 208 and contacts such as 212 on the bottom of the substrate as described above for FIG. 2. A corresponding bonding diagram having bonding wires is shown in FIG. 4. Die contact pads 207 on the die 202 enable the connection to corresponding contact pads 208 on the substrate by way of bonding wires 206.

Figure 5:
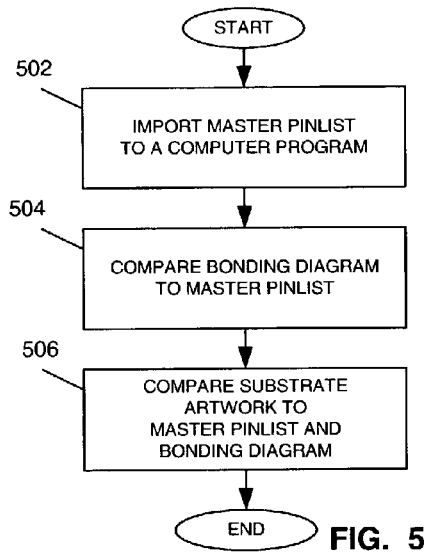
FIG. 5 is a flow chart showing a method of verifying substrate artwork according to the present invention.

Turning now to FIG. 5, a flow chart shows a method for verifying substrate artwork according to the present invention. At step 502, a master pinlist is imported to a computer program that enables methods of the present invention. The computer program could be installed on any computer device, such as the CAD equipment 120 adapted to run CAD software. At step 504, the computer program then matches a bonding diagram to the master pinlist. At a step 506, the computer program then verifies the substrate artwork against the master pinlist and bonding diagram.

Figure 6:
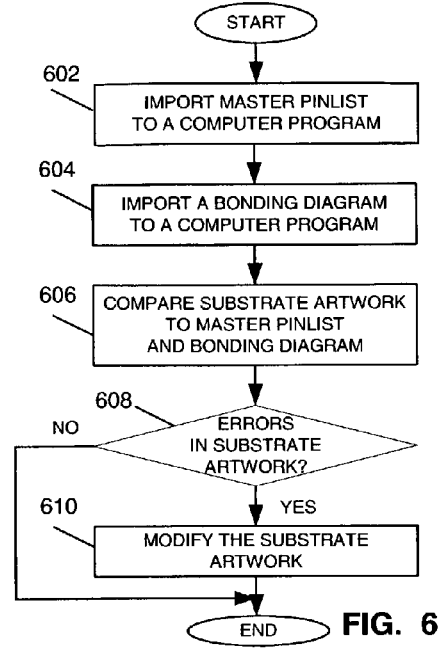
FIG. 6 is a flow chart showing a method of verifying substrate artwork according to an alternative embodiment the present invention.

Turning now to FIG. 6, a flow chart shows a method for verifying substrate artwork according to an alternative embodiment of the present invention. In particular, at step 602, a master pinlist is imported to a computer program. The master pinlist could be imported, for example, to the computer program on CAD equipment 102 of FIG. 1. At step 604, a bonding diagram is also imported to the computer program. At step 606, the computer program then verifies the substrate artwork against the master pinlist and the bonding diagram. At step 608, the computer program then determines whether there are errors in the substrate artwork. If so, at step 610, the substrate artwork is modified. The substrate artwork could be modified by the program which originally generated the substrate artwork, or by the computer program of the present invention.

Figure 7:
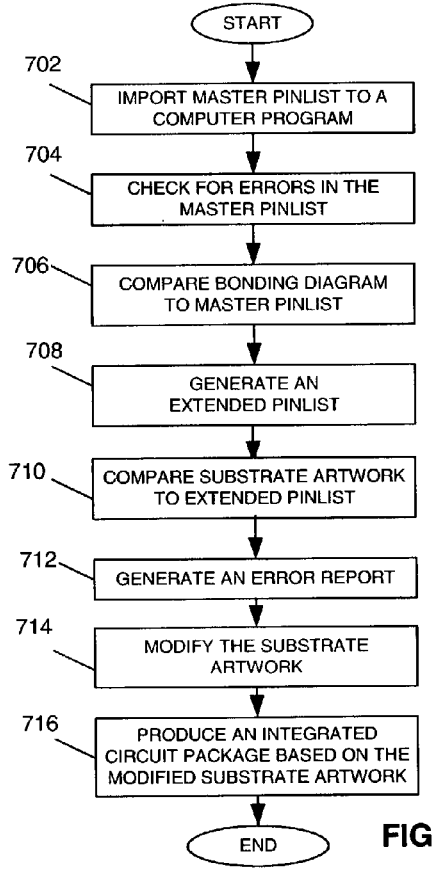
FIG. 7 is a flow chart showing a method of verifying substrate artwork according to another alternative embodiment of the present invention.

Turning now to FIG. 7, a method of verifying substrate artwork according to a further alternative embodiment of the present invention is shown. In particular, at a step 702, a master pinlist is imported to a computer program. At step 704, the computer program checks errors in the master pinlist. At step 706, the computer program then compares a bonding diagram to the master pinlist. At step 708, the computer program then generates an extended pinlist. The extended pinlist preferably includes information on the original netlist, in addition to bonding points on the die pad and on the substrate. The extended pinlist also preferably includes locations of pins on the BGA package. At a step 710, the computer program then compares the substrate artwork to the extended pinlist. At a step 712, the computer program then generates a report indicating any errors in the substrate artwork with respect to the bonding diagram and the master pinlist. At a step 714, the substrate artwork is then modified as necessary. Finally, at a step 716, an integrated circuit package based upon the modified substrate artwork is then produced.

According to one aspect of the embodiment of FIG. 7, the present invention enables the generation of an extended pinlist by combining the master pinlist with the bond diagram. The present invention also enables verification from only the standard output documents of a BGA design, including the bonding diagram and substrate artwork. The verification process flow is independent of the design flow.

Finally, the present invention minimizes the risk of software errors or human intervention mistakes in a single software platform by applying fundamental principles in designing fault-tolerant systems. That is, because the computer program employing the methods of the present invention is independently verifying the master pinlist, a bonding diagram and substrate artwork, each of which has been generated and/or edited by a separate computer program, any error, such as a human error or software error, would be detected.

Turning now to FIG. 8, a flow chart shows a detailed method for verifying substrate artwork according to the present invention. In particular, at a step 802, a master pinlist is imported to a computer program. The computer program could reside on the CAD equipment 102 of FIG. 1, for example. At a step 804, the computer program checks errors in the master pinlist. At step 806, the computer program then determines whether errors are found. If so, at a step 808, the master pinlist is modified. The master pinlist could be modified by the program, which originally generated the master pinlist, or by the computer program of the present invention. At a step 810, the computer program then generates a first report listing errors in the master pinlist.

The first report can include one or more of the following items. One, the report can include a reference to a non-existent ball. That is, the item will indicate that the master pinlist is referring to a ball that does not exist in the chosen package. Two, a ball can be assigned to two different nets (i.e. connection). Three, the warning list can also report a no-connect ball. Finally, four, the warning list can indicate the unbonded pads. Some or all of these warnings will caution a user to confirm that such unusual-occurrences are acceptable.

At a step 812, the computer program matches a bonding diagram to the master pinlist. At a step 814, the computer program then determines whether there are any errors in the bonding diagram. If so, at step 816, the computer program then generates a second report listing the errors in the bonding diagram. Such errors can indicate pads missing a bond wire, pads with multiple bond wires, floating bond wires, a supposedly unbonded pad with a bond wire, or a power or ground pad which is not bonded. At step 818, the bonding diagram is modified. The bonding diagram can be modified by the program which originally generated the bonding diagram, or by the computer program of the present invention.

At step 820, the computer program then generates an extended pinlist based upon the bonding diagram and the master pinlist. At step 822, the computer program then compares substrate artwork to the extended pinlist. At step 824, the computer program then determines whether there are any errors in the substrate artwork. If so, at step 826, the computer program generates a third report indicating errors in the substrate artwork, and at step 828 the substrate artwork is modified. The substrate artwork could be modified by the program which originally generated the substrate artwork, or by the computer program of the present invention. The above steps are repeated until all mismatches among the three components—master pinlist, bonding diagram, and substrate artwork—are corrected or waived in the final revisions of all three components. Finally, at step 830, an integrated circuit package, such as a wirebond BGA, is produced.

Figure 9:
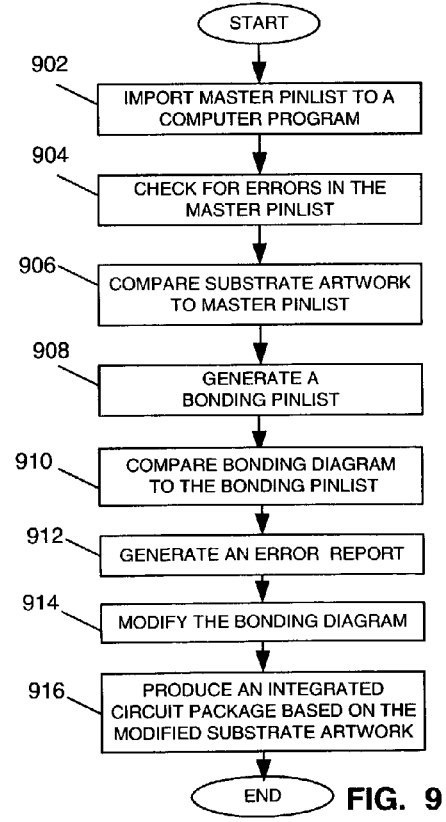
FIG. 9 is a flow chart showing a method of verifying a bonding diagram according to the present invention.

Turning now to FIG. 9, a method of verifying a bonding diagram by the computer program according to the present invention is shown. In particular, at a step 902, a master pinlist is imported to a computer program. At a step 904, the computer program checks errors in the master pinlist. At step 906, the computer program then compares substrate artwork to the master pinlist. At a step 908, the computer program then generates a bonding pinlist. The bonding pinlist preferably includes locations or coordinates of bond points for both ends of the bond wire, which would correspond to bond pads on the die and the substrate. The bonding pinlist also preferably includes location information on pins on the BGA package.

At step 910, the computer program then compares a bonding diagram to the bonding pinlist. At a step 912, the computer program then generates an error report indicating any errors in the substrate artwork with respect to the bonding diagram and the master pinlist. At a step 914, the bonding diagram is then modified as necessary. Finally, at step 916, an integrated circuit package based upon the modified substrate artwork is then produced. Accordingly, the method of FIG. 9 enables a design process where the master pinlist and the substrate artwork are combined into a bonding pinlist which is used to verify the bonding diagram.

Turning now to FIG. 10, a flow chart shows a detailed method for verifying a bonding diagram according to the present invention. In particular, at a step 1002, a master pinlist is imported to a computer program. The computer program could reside on the CAD equipment 102 of FIG. 1, for example. At a step 1004, the computer program then checks errors in the master pinlist. At step 1006, the computer determines whether errors are found. If so, at a step 1008, the master pinlist is modified. At step 1010, the computer program then preferably generates a first report listing errors in the master pinlist. At a step 1012, the computer program then compares substrate artwork to the master pinlist. At step 1014, the computer program then determines whether there are any errors in the substrate artwork. If so, at step 1016, the computer program then generates a second report listing the errors in the substrate. At a step 1018, the substrate artwork is modified.

At step 1020, the computer program then generates a bonding pinlist based upon the bonding diagram and the master pinlist. At step 1022, the computer program then compares a bonding diagram to the bonding pinlist. At step 1024, the computer program then determines whether there are any errors in the bonding diagram. If so, at a step 1026, the computer then generates a third report indicating errors in the bonding diagram, and at a step 1028 the bonding diagram is modified. The procedure is repeated until in the final revisions of all three components all mis-matches among the three components—master pinlist, bonding diagram, and substrate artwork are corrected or waived. Finally, at a step 1030, an integrated circuit package is produced.

Figure 11:
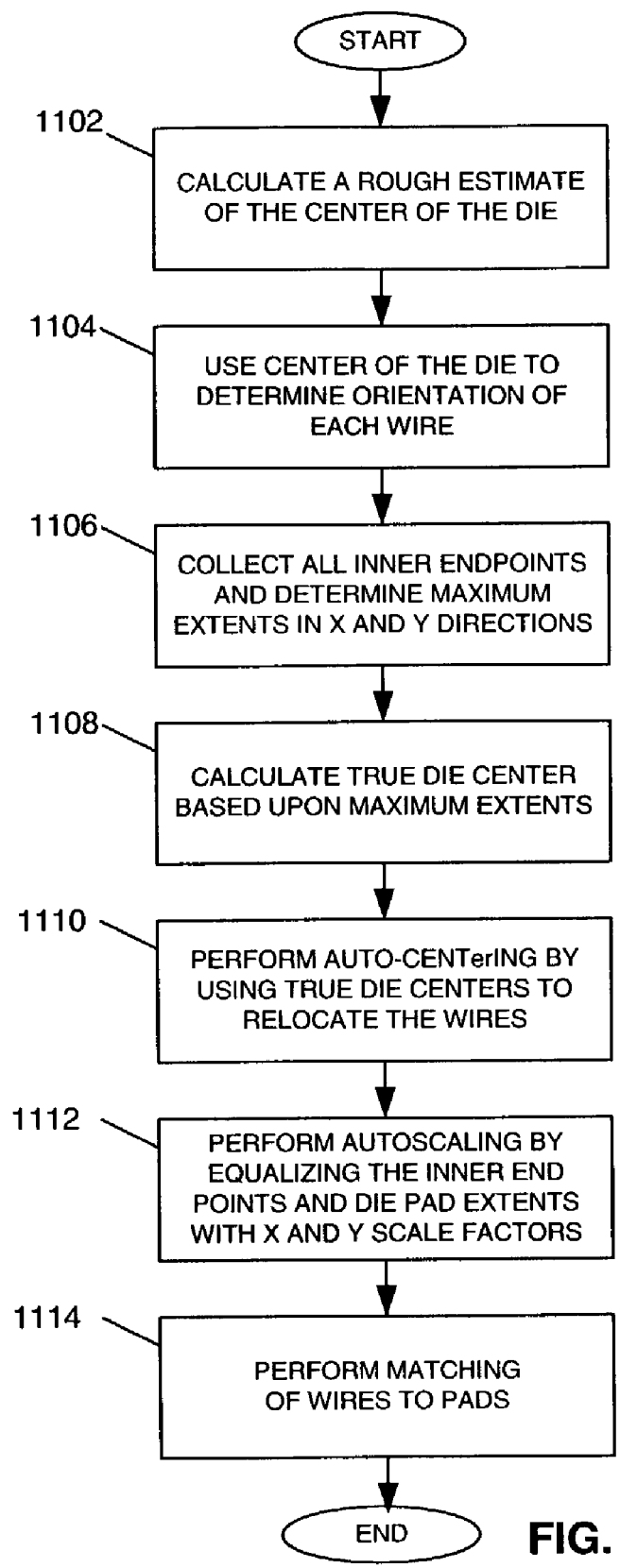
FIG. 11 is a flow chart showing a method of comparing a bonding diagram to a master pinlist according to the present invention.

Turning now to FIG. 11, a flow chart shows a method of comparing a bonding diagram to a master pinlist according to the present invention. Because bonding diagrams, unlike master pinlists, are typically not to scale or properly centered, it is necessary to calculate the correct bond locations associated with bonds in the bonding diagram. Accordingly, the following steps are preferably performed when comparing the bonding diagram to a master pinlist. Assuming that the bond wires are well-behaved (i.e., they are present at all four sides looking from the center of the die) and that they are roughly symmetric in that the maximum extents to the left and right are similar and the maximum extents to the top and bottom are similar, at a step 1102, a rough estimate of the center of the die is calculated. At step 1104, the estimated die center is used to determine the orientation of each wire. That is, the end points that are closer to the die center, known as the inner end points, are identified. At a step 1106, the inner end points are collected and the maximum extents in the X and Y dimension are determined. Because the maximum extent of endpoints is proportional to the maximum extent of the die pads, at a step 1108, the true die-center can be calculated. At step 1110, in a process called auto-centering, the true die-center is used to relocate the wires such that the new die center is at the origin (0,0). At a step 1112, auto-scaling is then performed by equalizing the inner end point extents and the die pad extents with an X-scale factor and a Y-scale factor. Although the X-scale factor and the Y-scale factor can be different, in practice they are usually the same. At a step 1114, the wires are matched to the pads.

A pad is matched to a wire if the auto-scaled inner end point of the wire falls within the neighborhood of the center of the pad. For example, each of pads of the die could be a square, with the matching wire's inner end point falling within a predetermined circle centered within the square. Wires are extracted from the drawing, auto-scaling and optional auto-centering are applied, and the inner end points of the wires are paired up with the die pads with certain allowed tolerance (such as 10 µm). In an error-free case, all die pads will be matched with their corresponding wires.

It can therefore be appreciated that the new and novel method and system for producing an integrated circuit package has been described. It will be appreciated by those skilled in the art that, given the teaching herein, numerous alternatives and equivalents will be seen to exist which incorporate the disclosed invention. As a result, the invention is not to be limited by the foregoing embodiments, but only by the following claims.

What is claimed is:

1. A method of producing a wirebond ball grid array, the method comprising the steps of:
   importing a master pinlist to a computer program;
   importing a bonding diagram to the computer program; and
   verifying, by the computer program, substrate artwork against the master pinlist and the bonding diagram;
   the substrate artwork describing connections between contacts of a substrate of the wirebond ball grid array.

2. The method of claim 1 further comprising a step of identifying errors in the master pinlist.

3. The method of claim 2 further comprising a step of generating a report listing the errors in the master pinlist.

4. The method of claim 1 further comprising a step of comparing a bonding diagram to the master pinlist to identify mismatches between the bonding diagram and the master pinlist.

5. The method of claim 4 further comprising a step of generating a report listing the mismatches between the bonding diagram and the master pinlist.

6. The method of claim 1 further comprising a step of developing an extended pinlist.

7. The method of claim 6 further comprising a step of generating a report listing errors between the substrate artwork and the extended pinlist.

8. A method of producing a wirebond ball grid array, the method comprising the steps of:
   importing a master pinlist to a computer program;
   importing a bonding diagram to a computer program;
   comparing the bonding diagram to the master pinlist;
   generating an extended pinlist based upon the master pinlist and the bonding diagram;
   verifying substrate artwork against the extended pinlist; and
   generating a report listing the errors in the substrate artwork;
   the substrate artwork describing connections between contacts of a substrate of the wirebond ball grid array.

9. The method of claim 8 further comprising a step of identifying errors in the master pinlist.

10. The method of claim 9 further comprising a step of generating a report listing the errors in the master pinlist.

11. The method of claim 10 further comprising a step of modifying the master pinlist.

12. The method of claim 8 wherein the step of comparing a bonding diagram to the master pinlist comprises identifying mismatches between the bonding diagram and the master pinlist.

13. The method of claim 12 further comprising a step of generating a report listing the mismatches between the bonding diagram and the master pinlist.

14. The method of claim 13 further comprising a step of modifying the bonding diagram using auto-centering and auto-scaling.

15. A method of producing a wirebond ball grid array, the method comprising the steps of:
   importing a master pinlist to a computer program;
   importing a bonding diagram to a computer program;
   comparing the bonding diagram to the master pinlist and identifying mismatches between the bonding diagram and the master pinlist;
   generating a report listing the mismatches between the bonding diagram and the master pinlist;
   modifying the bonding diagram using auto-centering and auto-scaling;
   generating an extended pinlist based upon the master pinlist and the bonding diagram;
   verifying substrate artwork against the extended pinlist;
   generating a report listing the errors in the substrate artwork; and
   generating a third report listing errors between the substrate artwork and the extended pinlist.

16. The method of claim 15 further comprising a step of modifying the substrate artwork.

17. The method of claim 16 further comprising a step of producing a wirebond ball grid array based upon modified substrate artwork.

18. A method of producing a ball grid array, the method comprising the steps of:
   importing a master pinlist to a computer program;
   identifying errors in the master pinlist;
   modifying the master pinlist;
   generating a first report listing the errors in the master pinlist;
   importing a bonding diagram to the computer program;
   comparing a bonding diagram to the master pinlist;
   generating a second report listing the mismatches between the bonding diagram and the master pinlist;
   modifying the bonding diagram;
   verifying substrate artwork against the master pinlist;
   generating a third report listing errors between the master pinlist, the bonding diagram and the substrate artwork;
   modifying the substrate artwork; and
   producing a wirebond ball grid array based upon the modified substrate artwork.

19. A method of producing a wirebond ball grid array, the method comprising the steps of:
   importing a master pinlist to a computer program;
   importing substrate artwork to the computer; and
   verifying, by the computer program, a bonding diagram against the master pinlist and the substrate artwork;
   the substrate artwork describing connections between contacts of a substrate of the wirebond ball grid array.

20. The method of claim 19 further comprising a step of identifying errors in the master pinlist.

21. The method of claim 19 further comprising a step of generating a report listing the errors in the master pinlist.

22. The method of claim 19 further comprising a step of comparing a bonding diagram to the master pinlist to identify mismatches between the bonding diagram and the master pinlist.

23. The method of claim 22 further comprising a step of generating a report listing the mismatches between the bonding diagram and the master pinlist.

24. The method of claim 19 further comprising a step of developing an extended pinlist.

25. The method of claim 24 further comprising a step of generating a report listing errors between the substrate artwork and the extended pinlist.

26. A system for producing a wirebond ball grid array, the system comprising:
   means for importing a master pinlist to a computer program;
   means for importing a bonding diagram to the computer program; and
   means for verifying, by the computer program, substrate artwork against the master pinlist and the bonding diagram;
   the substrate artwork describing connections between contacts of a substrate of the wirebond ball grid array.

27. The system of claim 26 further comprising means for identifying errors in the master pinlist.

28. The system of claim 27 further comprising means for generating a report listing the errors in the master pinlist.

29. The system of claim 26 further comprising means for comparing a bonding diagram to the master pinlist to identify mismatches between the bonding diagram and the master pinlist.

30. The system of claim 29 further comprising means for generating a report listing the mismatches between the bonding diagram and the master pinlist.

31. The system of claim 26 further comprising means for developing an extended pinlist.

32. The system of claim 26 further comprising means for generating a report listing errors between the master pinlist, the bonding diagram and the substrate artwork.

33. The system of claim 26 further comprising means for producing an integrated circuit package based upon the substrate artwork.

* * * * *